United States Patent [19]

Lenglen

[11] Patent Number: 5,599,398
[45] Date of Patent: Feb. 4, 1997

[54] PROCESS AND MACHINE FOR CLEANING PARTS

[76] Inventor: Jean-Luc Lenglen, 91, rue du Bocage, Merignies, F-59710 Pont-a-Marcq, France

[21] Appl. No.: 513,172

[22] Filed: Aug. 9, 1995

[51] Int. Cl.⁶ .................................................. B08B 3/12
[52] U.S. Cl. .................................... 134/1; 134/30; 134/31; 134/32; 134/37; 134/61; 134/68; 134/74; 134/105; 34/216; 34/419; 34/423
[58] Field of Search ................................. 134/1, 30, 31, 134/32, 37, 61, 68, 74, 184, 105; 34/216, 419, 423

[56] References Cited

U.S. PATENT DOCUMENTS

| | | | |
|---|---|---|---|
| 2,854,360 | 9/1958 | Pajeo | 134/30 |
| 4,777,804 | 10/1988 | Bowling et al. | 62/85 |
| 4,886,082 | 12/1989 | Kato et al. | 134/61 |
| 5,028,273 | 7/1991 | Weltmer, Jr. et al. | 134/42 |
| 5,045,120 | 9/1991 | Mittag et al. | 134/32 |
| 5,203,927 | 4/1993 | Yoshida et al. | 134/30 |
| 5,218,980 | 6/1993 | Evans | 134/74 |
| 5,333,628 | 8/1994 | Ogata et al. | 134/184 |

FOREIGN PATENT DOCUMENTS

| | | |
|---|---|---|
| 241749 | 10/1987 | European Pat. Off. . |
| 2675418 | 10/1992 | France . |
| 3235826 | 3/1984 | Germany . |
| 274173 | 7/1988 | Germany . |

*Primary Examiner*—Jill Warden
*Assistant Examiner*—Sharidan Carrillo
*Attorney, Agent, or Firm*—Renner, Kenner, Greive, Bobak, Taylor & Weber

[57] ABSTRACT

For the purpose of cleaning parts (8), the invention comprises subjecting the latter to a prior treatment for lowering the temperature by means of a neutral gas, for example nitrogen, in an oxygen free medium, passing the parts into a cleaning chamber (4, 30) followed by subjecting the parts in succession to a partial reheating treatment in an oxygen free medium and to a treatment for drying and raising the temperature substantially to the ambient temperature.

12 Claims, 1 Drawing Sheet

PROCESS AND MACHINE FOR CLEANING PARTS

SUMMARY OF THE INVENTION

The present invention relates to the cleaning of very diverse parts, for example mechanical, electrical or electronic parts, this cleaning being carried out either on new parts, in particular after their manufacture or assembly, or on parts which have already been used, for example for their maintenance.

An object of the invention is to permit a cleaning of the parts without producing an oxidation of the latter, or a nuisance for the environment, in particular by emanations of the cleaning product, or a risk for the health and safety of the users.

In a first aspect of the invention, the latter therefore provides a process for cleaning parts which is characterized in that it comprises the following successive steps:

a) subjecting the parts, initially at ambient temperature, to a pretreatment for lowering the temperature by means of a neutral gas in a medium substantially oxygen free;

b) subjecting the parts to a cleaning treatment at low temperature;

c) passing the parts in a neutral gaseous medium substantially oxygen free and at a temperature higher than that of the cleaning treatment;

d) and drying and reheating the parts by means of a hot gas substantially to the ambient temperature.

Thus, the process of the invention is carried out at low temperature, which reduces the emanations and, further, the humidity of the parts and of the medium surrounding them is eliminated prior to and after the cleaning proper, which avoids the risk of oxidation of the parts and of addition of water to the cleaning product.

Advantageously, the neutral gas is nitrogen and the hot gas is air.

For example, the cleaning is carried out by immersion in a bath and/or by spraying with the cleaning liquid. This cleaning may be completed by an ultrasonic treatment.

Further, the neutral gas is for example at about 0° C., the cleaning product is a liquid at −15° C., and the hot gas is blown at about 60°–70° C.

In a second aspect, the invention provides a machine for carrying out the aforementioned process, said machine being characterized in that it comprises: means for subjecting the parts at ambient temperature to a pretreatment for lowering the temperature by means of a neutral gas in a medium substantially oxygen free, means for subjecting the parts to a cleaning treatment at low temperature, means for passing the parts into a neutral gaseous medium substantially oxygen free and at a temperature higher than the temperature of the cleaning treatment, and means for drying and reheating the parts by means of a hot gas substantially to the ambient temperature.

In a preferred embodiment, the machine according to the invention comprises an entrance chamber for the temperature lowering pretreatment, a chamber for cleaning at low temperature enclosing a cleaning vessel, a dehumidification lock chamber, a drying chamber, an exit chamber, and movable means for providing the communication between said chambers, said vessel and said look chamber for hermetically isolating each one thereof.

Advantageously, the cleaning chamber comprises means for blowing the neutral gas externally and internally relative to the cleaning chamber, and the latter comprises a cover which is movable in the cleaning chamber.

The entrance chamber, the cleaning chamber and the dehumidification exit lock chamber each comprise means for blowing the neutral gas and an extractor for vapours and steam; likewise, the exit chamber comprises means for blowing hot air and an extractor.

BRIEF DESCRIPTION OF THE DRAWING

The invention will be understood from the following further description with reference to the accompanying drawing which is part of the disclosure and of which

DETAILED DESCRIPTION OF THE PREFERRED EMBODIMENT

Figure 1:
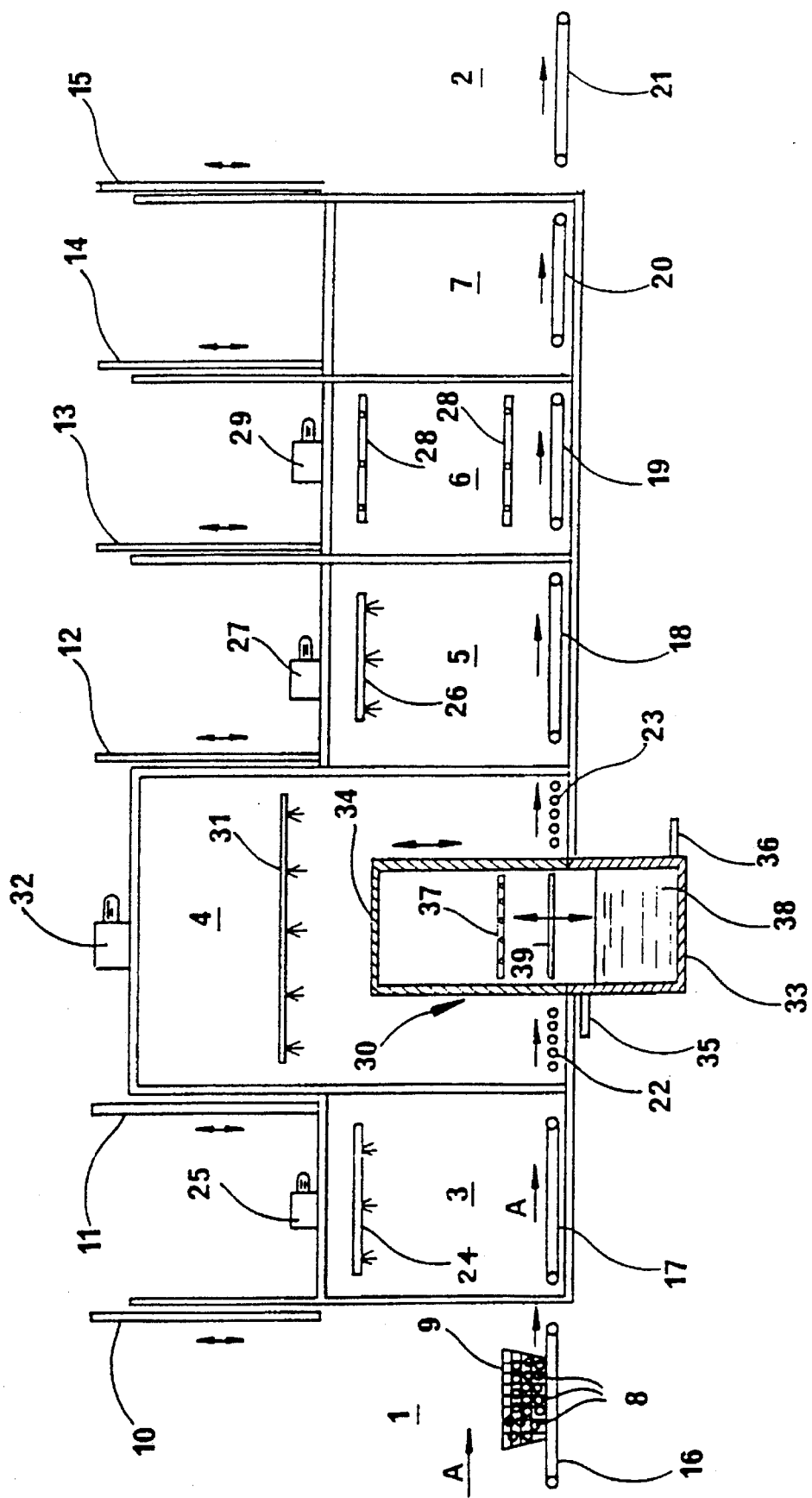
FIG. 1 is a very diagrammatic side elevational view of a machine arranged in accordance with a preferred embodiment for carrying out the process according to the invention.

As employed here, "cleaning" is intended to mean any operation carried out on parts for eliminating from the surface of the latter impurities, soiling or foreign bodies. For example, such a cleaning may be the degreasing of new parts after their manufacture.

The process according to the invention will now be described in relation to a machine arranged in accordance with a preferred embodiment.

The machine according to the invention comprises a succession of chambers or enclosures which are disposed side by side following on one another from an entrance station 1 to an exit station 2. These chambers are, in the order of the passage of the parts, an entrance chamber 3 in which the parts are subjected to a pretreatment for lowering the temperature in an oxygen free medium, a cleaning chamber 4 in which the cleaning proper is carried out at low temperature, a dehumidification exit lock chamber 5 in which the cleaned parts are subjected to a partial reheating in an oxygen free medium, a chamber 6 for drying and reheating the parts substantially to the ambient temperature, and an exit chamber 7.

The parts 8 to be cleaned are for example placed in an openwork basket 9 which will travel step by step from the entrance station 1 to the exit station 2 so that the parts 8 are subjected in succession to a temperature lowering pretreatment by means of a neutral gas, a cleaning treatment, a partial reheating treatment after cleaning, and a treatment for drying and increasing the temperature substantially to the ambient temperature.

Each of the chambers 3 to 7 communicate with the adjacent chamber or chambers through a door or the like which, in the open position, permits the free communication between the chambers and, in the closed position, hermetically isolates the two corresponding chambers.

Each of these chambers has generally the shape of a parallelepiped of which a part of the two vertical walls, perpendicular to the direction A of travel of the basket 9, is formed, in the presently-described embodiment, by a door which is vertically movable between an upper position shown in the FIGURE, in which the chamber is open on the side adjacent said door, and a lower position (not shown) in which the vertical wall on which said door is mounted is hermetically closed. Thus, there is provided a communication door 10 between the entrance station 1 and the entrance chamber 3, a communication door 11 between the chambers 3 and 4, a communication door 12 between the chambers 4 and 5, a communication door 13 between the chambers 5 and 6, a communication door 14 between the chambers 6 and 7, and a communication door 15 between the exit chamber 7 and the exit station 2.

The entrance station 1, the chambers 3 to 7 and the exit station 2 each comprise at least one conveyor for conveying the basket 9 through the machine. Thus, the entrance station 1, the chambers 3, 5, 6, 7 and the exit station 2 each comprise a respective conveyor 16–21, for example of the endless belt type, while the cleaning chamber 4 comprises an entrance conveyor 22 and an exit conveyor 23, for example of the roller type, respectively before and after the cleaning station proper relative to the direction of travel of the basket. The conveyors 16 to 23 are arranged to ensure that the basket 9 travels thereon in a horizontal plane.

As is diagrammatically represented, the entrance chamber 3 comprises means 24 for blowing a neutral gas, advantageously nitrogen, in said chamber, and an extractor 25, and likewise the lock chamber 5 comprises means 26 for blowing a neutral gas, advantageously nitrogen, and an extractor 27. The drying chamber 6 comprises means 28 for blowing hot air and an extractor 29. The exit chamber 7 acts only as a transition lock chamber between the drying chamber 6 and the exit station 2 and is therefore not equipped with means for blowing gas or hot air; the two doors 14 and 15 thereof merely permit the cleaned parts 8 to pass from the drying chamber 6 to the exit station 2 without any direct communication between this chamber and this station.

Advantageously, in order to avoid any risk of humidity in the cleaning chamber 4, the latter is double and encloses a cleaning vessel 30 in a neutral gas environment, For this purpose, on one hand, the cleaning chamber 4 comprises, outside the vessel 30, means 31 for blowing neutral gas and an extractor 32 and, on the other hand, the cleaning vessel 30 is constituted by a fixed lower tank 33 and an upper cover 34 which is vertically movable, as shown by the double arrow, between two positions, namely a lower position shown in the FIGURE in which the vessel 30 is hermetically closed, and an upper position (not shown) in which the vessel is open for receiving the basket 9 coming from the conveyor 22 and, after cleaning, discharging this basket onto the exit conveyor 23. Advantageously, the vessel 30 is heat insulated.

The tank 33 is provided with a pipe 35 for the entrance of the cleaning liquid, and a lower pipe 36 for discharging this liquid after cleaning, a controlled solenoid valve being provided on each of these pipes. Advantageously, the cover 34 comprises means, diagrammatically represented at 37, for spraying cleaning liquid after immersion in the bath 38, for the purpose of providing a final rinsing of the parts before they are discharged downstream.

In a preferred embodiment of the invention, the cleaning is carried out in succession by an immersion in the bath 38, then a spraying, but it is not excluded that this cleaning be carried out either solely by immersion or solely by spraying.

The essential steps of the process according to the invention will now be described with reference to the operation of the machine arranged, as previously mentioned, in accordance with a preferred embodiment of the invention.

The basket 9 enclosing the parts 8 to be cleaned and at ambient temperature is placed on the conveyor 16 of the entrance station 1. The door 10 is open and the door 11 closed. The basket 9 is conveyed on the conveyor 17 of the entrance chamber 3, after which the door 10 is closed and the nitrogen at about 0° C. is blown into this chamber at the same time as the starting up of the extractor 25. During this first step, the parts 8 are cooled and dehumidified in an oxygen free medium, which avoids any risk of subsequent oxidation and condensation on the parts. At the same time, with the cover 34 of the vessel 30 open, nitrogen is blown into the cleaning chamber 4 and into the vessel 30 to eliminate the air and the extractor 32 is started up, which eliminates the air, its oxygen, and all the vapours and steam present in the cleaning chamber 4, including the space inside the open vessel 30. During this step, the door 12 is obviously closed. After a predetermined period, the door 11 is opened and the basket 9, containing the cooled and dehumidified parts 8, is conveyed on the conveyor 22 and then on a movable platform 39 of the tank 33. This transfer is achieved either by the effect of inertia or for example by means of a cylinder device (not shown); the basket 9 is immobilized on the platform 39 in the desired position by means of any suitable positioning and stopping means (not shown). The door 11 is closed and the blowing of nitrogen in the chamber 3 is stopped. The cover 34 is lowered to the closing position, after which the blowing of nitrogen in the cleaning chamber 4, outside the vessel 3, is stopped. The platform 39 carrying the basket 9 is lowered into the bath 38 which is for example at −15° C., while undergoing for example a to and fro motion to ensure a good stirring. After a predetermined period, the platform 39 is raised to the illustrated position and, optionally, the parts 8 are rinsed by spraying the cleaning product by the means 37 and are subjected to a complementary ultrasonic cleaning. The cover 34 is moved upwardly to open the vessel 30 and the extractor 32 is again actuated for affecting a controlled extraction of the cleaning vapours which are treated on the downstream side to avoid their discharge into the surrounding medium. The cleaning liquid 38 is discharged either at each cycle, or after a predetermined number of cycles, for the purpose of a treatment rendering this liquid re-usable.

With the door 13 closed, nitrogen, for example also at 0° C., is blown in the chamber 5 so as to eliminate any trace of humidity and oxygen, after which the door 12 is opened and the basket 9 conveyed, by means not shown, from the platform 39 to the entrance end of the conveyor 18 of the chamber 5. The door 12 is then closed, the conveyor 18 immobilized so that the cleaned parts 8 are subjected to a partial reheating treatment in an oxygen free medium. With the door 14 closed, the door 13 is opened, and the basket 9 is conveyed on the conveyor 19 of the drying chamber 6. The door 13 is closed and hot and dry air, for example at 60°–70° C. is blown by the means 28 at the same time as the actuation of the extractor 29.

After a predetermined relatively short period of time, the parts 8 are dried and reheated substantially to the ambient temperature without being oxidized, the entry of drying air is stopped and with the door 15 closed, the door 14 is opened for the transfer of the basket 9 to the conveyor 20. The latter is immobilized and the door 14 is closed, after which the door 15 is opened and the basket 9 is transferred to the exit conveyor 21.

It will be understood that the machine is completed in the known manner by various safety, checking and control means (not shown).

It will be clear from the foregoing description that the invention provides a process and machine for cleaning parts which permit cleaning these parts with no risk of oxidation, no nuisance for the environment and no risk for the health and safety of the users.

It must be understood that the scope of the invention is not intended to be limited to the manner of carrying out the invention, to the embodiment or to the mode of application described, on the contrary various variants may be envisaged without departing from the scope of the invention defined in the claims.

What is claimed is:

1. A method for cleaning parts for example mechanical, electrical, or electronic parts, comprising the sequential steps of a) subjecting the parts, initially at ambient temperature, to a pretreatment for lowering the temperature of said parts to about 0° C., said pretreatment comprises subjecting the parts to a gas in a substantially oxygen free medium; b) subjecting the parts to a cleaning treatment, said cleaning treatment having a temperature which is less than about 0° C. and said ambient temperature; c) conveying said parts from said cleaning treatment to a post treatment comprising said gas in a substantially oxygen free medium, whereby said post treatment increases the temperature of said parts to about 0° C.; and, d) drying and reheating the cleaning parts substantially to ambient temperature by means of a hot gas.

2. A method according to claim 1, wherein said gas is nitrogen.

3. A method according to claim 1, wherein said hot gas is air.

4. A method according to claim 1, wherein the cleaning treatment is carried out by immersion in a cleaning liquid.

5. A method according to claim 1, wherein the cleaning treatment is carried out by spraying with a cleaning liquid.

6. A method according to claim 1, further comprising the step of subjecting the parts to an ultra sonic treatment.

7. A method according to claim 1, wherein said gas is blown at about 0° C., said cleaning treatment utilizes a liquid at about −15° C., and said hot gas is blown at about 60°–70° C.

8. An apparatus for cleaning parts, for example mechanical, electrical, or electronic parts, comprising a) a first means for pretreating the parts, initially at ambient temperature, to lower the temperature of said parts to about 0° C., said pretreatment comprises subjecting the parts to a gas in a substantially oxygen free medium; b) a second means for cleaning the parts from said pretreatment, said cleaning being performed at a temperature less than about 0° C. and said ambient temperature; c) a means for conveying said parts from said pretreating means to said cleaning means and from said cleaning means to a post treatment means comprising means for post treating said parts in a substantially oxygen free gas medium, whereby said post treatment increases the temperature of said parts to about 0° C.; d) a means for drying and reheating the cleaning parts substantially to ambient temperature by means of a hot gas, wherein said means for conveying transports said parts from said post treatment means to said drying and reheating means; and e) a plurality of locking means vertically positioned between each of said pretreatment means, cleaning means, post treatment means, and drying and reheating means to permit communication among each of said pretreatment means, cleaning means, post treatment means, and drying and reheating means for cleaning of said parts.

9. An apparatus according to claim 8, further comprising an entrance chamber for the pretreatment, a cleaning chamber enclosing a cleaning vessel, a dehumidification lock chamber, a drying chamber, an exit chamber and said plurality of locking means hermetically isolating and permitting communication between each of said chambers and said cleaning vessel.

10. An apparatus according to claim 9, wherein said cleaning chamber comprises means for blowing gas outside and inside said cleaning vessel.

11. An apparatus according to claim 9, wherein said cleaning vessel comprises said cleaning chamber.

12. An apparatus according to claim 9, wherein said chambers and said dehumidification lock chamber comprise a steam and vapor extractor.

* * * * *